(12) United States Patent
Serizawa

(10) Patent No.: US 7,155,470 B2
(45) Date of Patent: Dec. 26, 2006

(54) VARIABLE GAIN INTEGRATOR

(75) Inventor: Orimitsu Serizawa, Gyouda (JP)

(73) Assignee: Sanyo Electric Co., Ltd., Osaka (JP)

( * ) Notice: Subject to any disclaimer, the term of this patent is extended or adjusted under 35 U.S.C. 154(b) by 64 days.

(21) Appl. No.: 10/978,109

(22) Filed: Oct. 29, 2004

(65) Prior Publication Data

US 2005/0094751 A1    May 5, 2005

(30) Foreign Application Priority Data

Oct. 31, 2003    (JP)    ............... 2003-373613

(51) Int. Cl.
*G06F 7/38* (2006.01)

(52) U.S. Cl. ..................................... 708/444
(58) Field of Classification Search ............... 708/444
See application file for complete search history.

(56) References Cited

U.S. PATENT DOCUMENTS

| | | | | |
|---|---|---|---|---|
| 4,215,311 | A * | 7/1980 | Kittel et al. | ........... 375/216 |
| 5,142,354 | A * | 8/1992 | Suzuki et al. | ........... 348/677 |
| 6,384,761 | B1 * | 5/2002 | Melanson | ........... 341/143 |
| 6,486,810 | B1 * | 11/2002 | Cooklev et al. | ........... 341/143 |

* cited by examiner

*Primary Examiner*—Tan V. Mai
(74) *Attorney, Agent, or Firm*—Osha Liang LLP

(57) ABSTRACT

A variable-gain integrator includes a variable-gain multiplier for multiplying digital input data that are input in time sequence by variable gain, an adder for adding output data from the variable multiplier to previous integration data, a clip circuit for limiting output data from the adder to a predetermined range to obtain integration data, an integration value storage device for storing the integration data obtained from the clip circuit and supplying the integration data that are stored to the adder as the previous integration data, and a fixed multiplier for multiplying the integration data obtained by the clip circuit by fixed gain.

10 Claims, 13 Drawing Sheets

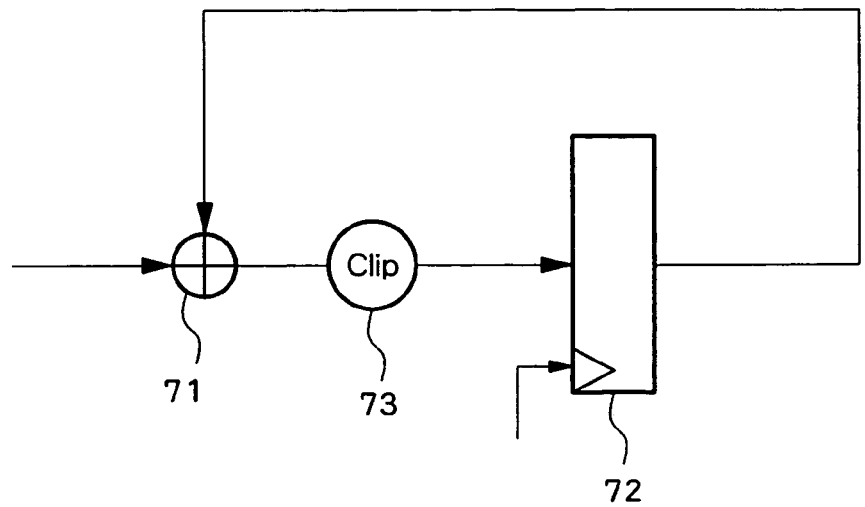
Fig. 13 - Prior Art
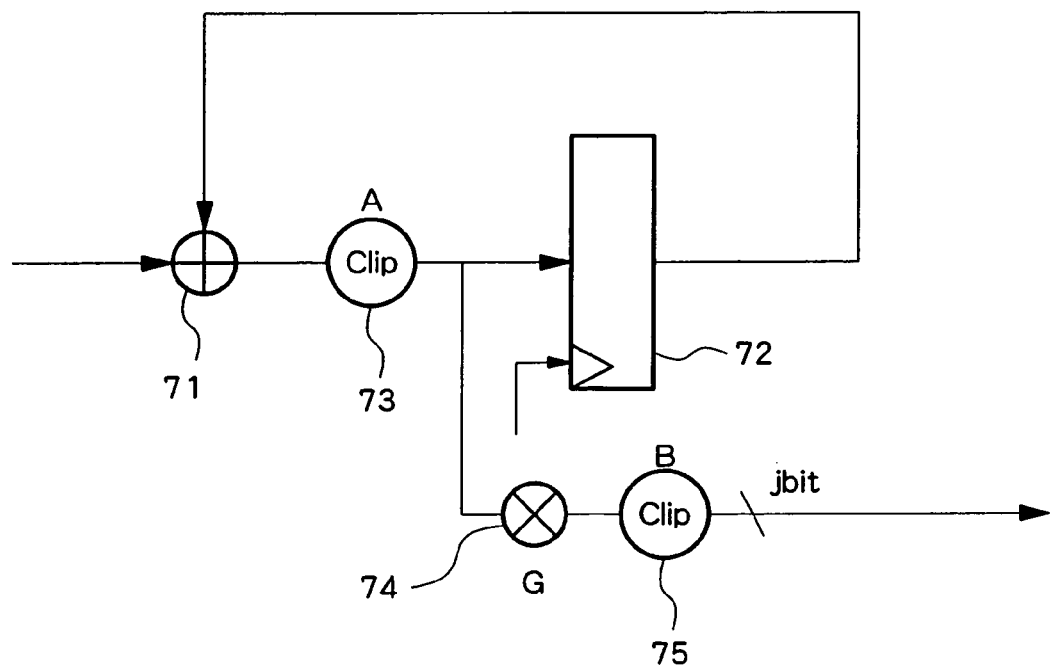
Fig. 14 - Prior Art

VARIABLE GAIN INTEGRATOR

CROSS-REFERENCE TO RELATED APPLICATIONS

The disclosure of Japanese Patent Application No. 2003-373613 including specification, claims, drawings, and abstract is incorporated herein by reference in its entirety.

BACKGROUND OF THE INVENTION

1. Field of the Invention

The present invention relates to a variable-gain integrator for accumulating and adding input data.

2. Description of Related Art

Integrators formed by a digital circuit are known. An example structure of such a digital integrator is shown in FIG. 13. Referring to FIG. 13, input data and data stored in a flip-flop (hereinafter referred to as FF) 72 are added by an adder 71, and the added data are stored in FF 72 at the next clock. As a result of repetition of this operation, the input data are accumulated and added up to thereby provide integration data. As the bit width of a bus and the number of bits of FF 72 are generally fixed in a digital circuit, in the example shown in FIG. 13, a clip circuit 73 is provided for clipping, thereby limiting the range of data after addition.

Multiplication of the integration data obtained through accumulation and addition by the gain before being output is often desirable. FIG. 14 shows a possible integrator structure in which integration data are multiplied by gain and then output. Referring to FIG. 14, a multiplier 74 multiplies integration data output from a clip circuit 73 provided at a point A, by gain G. The data output from the multiplier 74 are limited to the bit width j of the output bus by a clip circuit 75 provided at a point B.

The integrator shown in FIG. 14, however, suffers from a problem when the gain of the multiplier 74 is variable, as will be described using an example in which the bit width of the output bus is 4 and gain of the multiplier is variable among $1/16$, $1/8$, and $1/4$.

When the number of bits of FF 72 is set to 8 bits, the maximum value of the integration data (output data from the clip circuit 73) is 255 ("11111111" in binary). When the gain of the multiplier 74 is $1/16$, the maximum output data value of the multiplier 74 is 15 (binary "1111"), which needs no clipping operation after the multiplication. When the gain is $1/8$, the maximum output data value of the multiplier 74 is 31 ("11111"), and a clipping operation is required when the first higher bit is "1". When the gain is $1/4$, the maximum output data value of the multiplier 74 is 63 ("111111"), and a clipping operation is required when the first or second higher bit is "1". Accordingly, a clip circuit 75 for clipping after multiplication is required in addition to the clip circuit 73 for clipping after addition. Moreover, the clip circuit 75 used for clipping after multiplication must perform different clipping operations depending on the gain. As a result, a complicated circuit structure is required for an integrator as a whole.

On the other hand, when the number of bits of FF 72 is set to 6, the maximum value for the integration data is 63 ("111111" in binary number). In this case, the maximum output data values of the multiplier 74 are 3 ("0011"), 7 ("0111"), and 15 ("1111") when the gain of the multiplier 74 is $1/16$, $1/8$, and $1/4$, respectively. Accordingly, no clipping operations are necessary regardless of the gain. In this case, however, the data after multiplication range from 0 to 3 when the gain of the multiplier 74 is $1/16$ and from 0 to 7 when the gain is $1/8$, which are narrower than the data range, 1 to 15, of the output bus. Consequently, even when the maximum value 63 ("111111") is obtained as the integration data due to clipping in the clip circuit 73, the output data of the multiplier 74 becomes 3, which is too much smaller than the maximum value 15 of the output bus, when the gain of the multiplier 74 is $1/16$.

SUMMARY OF THE INVENTION

In accordance with one aspect of the present invention, a variable-gain integrator for accumulating and adding digital data which are input in time sequence comprises variable multiplication means for multiplying the input data by variable gain; addition means for adding output data from the variable multiplication means to previous integration data; data limitation means for limiting output data from the addition means to a predetermined range to obtain integration data; integration value storage means for storing the integration data obtained from the data limitation means and supplying the integration data which are stored to the addition means as the previous integration data; and fixed multiplication means for multiplying the integration data obtained by the data limitation means by fixed gain.

BRIEF DESCRIPTION OF THE DRAWINGS

A preferred embodiment of the present invention will be described in further detail based on the following drawings, wherein:

FIG. 13 is a block diagram showing a structure of a digital integrator; and

FIG. 14 is a block diagram showing a structure of an integrator in which integration data are multiplied by gain.

DETAILED DESCRIPTION OF PREFERRED EMBODIMENT

A preferred embodiment of the present invention will be described in further detail with reference to the drawings.

Figure 1:
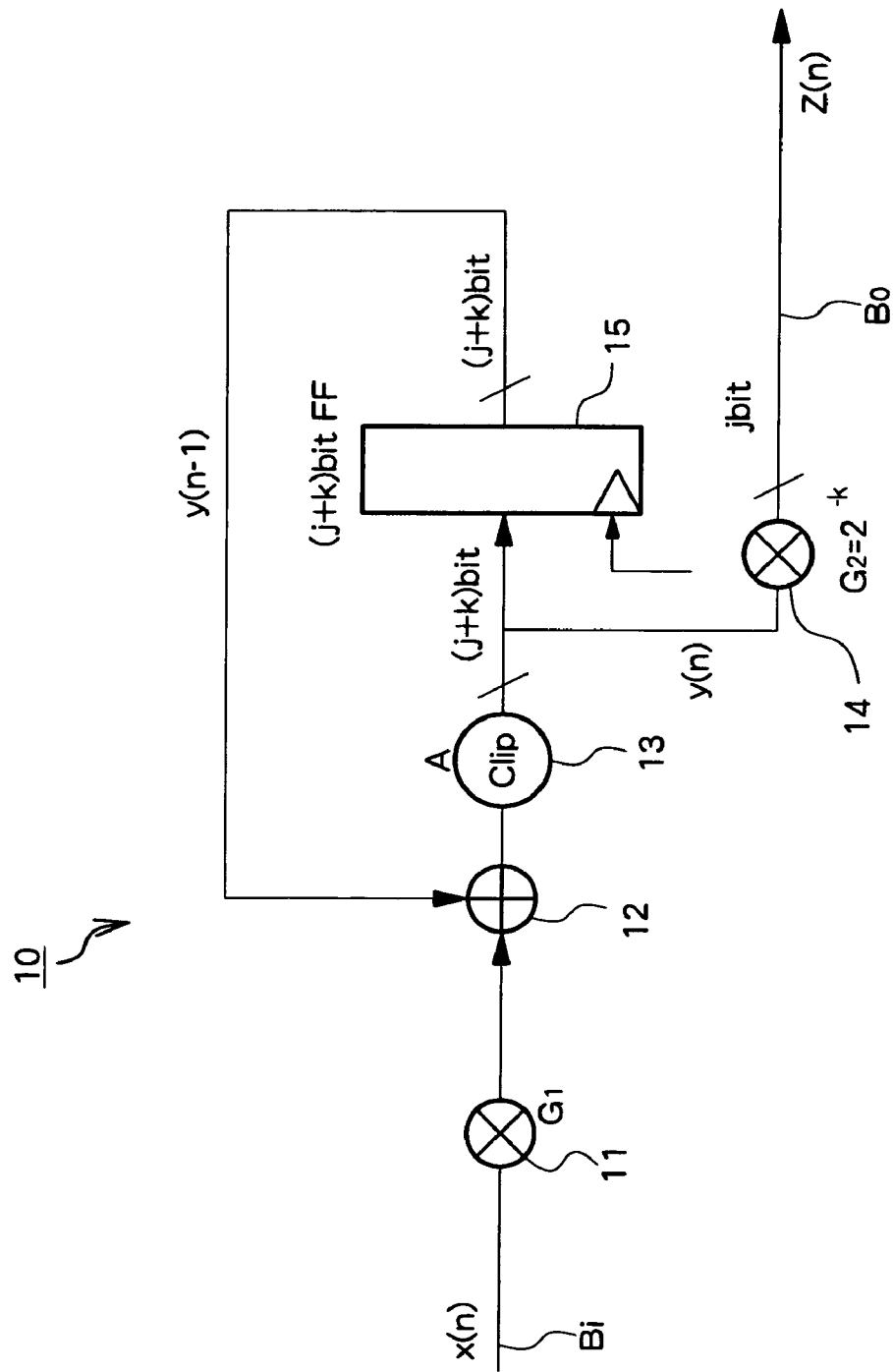
FIG. 1 is block diagram showing a structure of a variable-gain integrator.

FIG. 1 is a block diagram showing a structure of a variable-gain integrator in accordance with one embodiment of the present invention. The variable-gain integrator 10 is preferably utilized in a DC offset canceller and an AGC (Automatic Gain Control) circuit of a magnetic reproduction apparatus or the like. Referring to FIG. 1, the variable-gain integrator 10 comprises a variable multiplier 11, an adder 12, a clip circuit 13, a fixed multiplier 14, and an integration value storage device 15.

Figure 2:
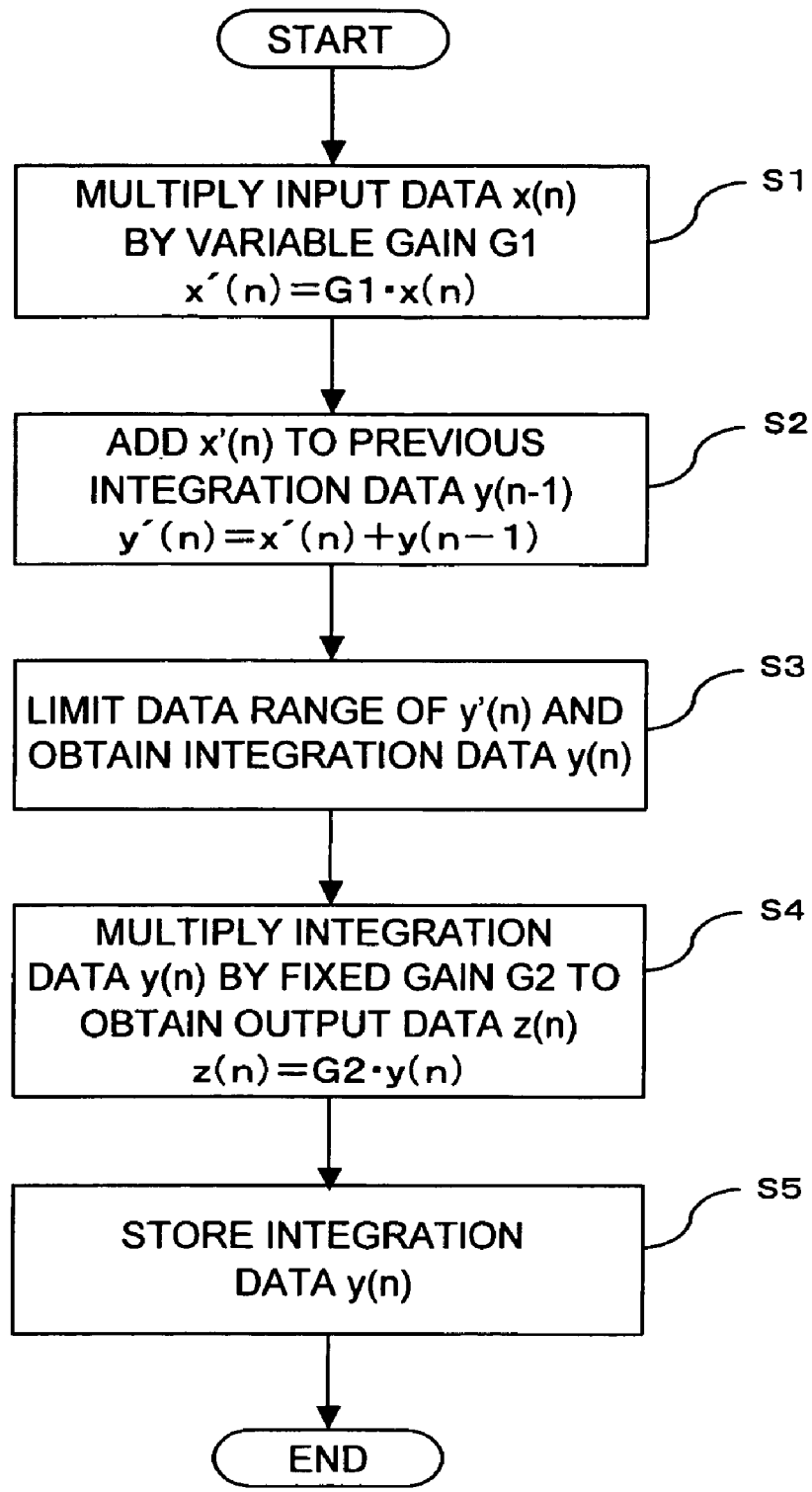
FIG. 2 is a flowchart showing an operation procedure of the variable-gain integrator.

FIG. 2 is a flowchart showing an operation procedure of the variable-gain integrator according to the present embodiment. The operation of the variable-gain integrator 10 will be described with reference to FIGS. 1 and 2.

The variable multiplier 11 multiplies digital input data x(n) (n=1, 2, 3, . . . ) to be integrated, supplied through a bus Bi, by variable gain G1, to thereby calculate data x'(n) (=G1·x(n)) (S1). The variable multiplier 11 then outputs the data x'(n) thus obtained to the adder 12.

The adder 12 adds the data x'(n) supplied from the variable multiplier 11 to the previous integration data y(n−1) stored in the integration value storage device 15, to thereby calculate data y'(n) (=x'(n)+y(n−1)) (S2). The adder 12 then outputs the data y'(n) thus obtained to the clip circuit 13.

The clip circuit 13 limits the data y'(n) supplied from the adder 12 to a predetermined range to obtain integration data y(n) (S3). Thus, values of the integration data y(n) can be limited to a range which allows data processing, such that infinite increase in the integration data y(n) can be prevented, for example. In this embodiment, the clip circuit 13 clips the data y'(n) to a data range from the minimum value $S_{min}$ to the maximum value $S_{max}$ which can be stored in the integration value storage device 15. More specifically, the clip circuit 13 compares the data y'(n) with the minimum value $S_{min}$ and the maximum value $S_{max}$. When the data y'(n) are greater than the maximum value $S_{max}$, the maximum value $S_{max}$ are output as the integration data y(n), and, when the data y'(n) are smaller than the minimum value $S_{min}$, the minimum value $S_{min}$ are output as the integration data y(n). With respect to the remaining data values y'(n) between the minimum value $S_{min}$ and the maximum value $S_{max}$, the data y'(n) are used as the integration data y(n). Consequently, the integration data y(n) range between the minimum value $S_{min}$ and the maximum value $S_{max}$. The clip circuit 13 outputs the integration data y(n) thus obtained to the fixed multiplier 14 and the integration value storage section 15.

The fixed multiplier 14 multiplies the integration data y(n) supplied from the clip circuit 13 by fixed gain G2 to thereby calculate output data z(n) (=G2·y(n)) (S4). The fixed multiplier 14 then supplies the output data z(n) thus obtained to the bus Bo. The output data z(n) range between $G2·S_{min}$ and $G2·S_{max}$, independently of the variable gain value G1.

The integration value storage device 15, on the other hand, stores the integration data y(n) supplied from the clip circuit 13 (S5). The integration value storage device 15 then supplies the stored integration data y(n), as the previous integration data, to the adder 12. The supplied integration data y(n) are added with the data x'(n+1) at step S2 in the following cycle.

With the repetition of the above-described operation, the input data x(n) are accumulated and added.

Here, setting of the gains G1 and G2, and the minimum value $S_{min}$ and the maximum value $S_{max}$ to be stored in the integration value storage device 15 or the like will be described. Here, the minimum and maximum data values which can be transmitted through the bus Bo are set to $B_{min}$ and $B_{max}$, respectively, and it is desired to vary gain between 1/p (p is a positive integer) and 1/q (q is a positive integer; q<p)), wherein the gain G2 is set to a fixed value 1/p and the gain G1 is variable between 1 or greater and p/q or less. The minimum value $S_{min}$ for the integration value storage device 15 is set to $p·B_{min}$ and the maximum value $S_{max}$ is set to $p·B_{max}$. Then, the integration data y(n) range between $p·B_{min}$ or greater and $p·B_{max}$ or smaller, and the output data from the fixed multiplier 14 range between $B_{min}$ or greater and $B_{max}$ or smaller, which corresponds to the range of data which can be transmitted through the bus Bo. Accordingly, it is not necessary to provide a clip circuit downstream of the fixed multiplier 14. Further, the range of output data corresponds to the range of data which can be transmitted through the data bus Bo irrespective of the variable gain G1.

Here, there is a possibility that data are lost in the variable multiplier 11 if the variable range of the gain G1 includes a value which is less than 1. For example, in a case where the gain G1 is ¼ and the variable multiplier 11 shifts the bit string by two to the right, input data 3 (corresponding to a binary number "11") becomes 0. Accordingly, when it is desired that gain be made variable in a range including a value of less than 1, it is preferable that the gain G1 is 1 or greater and the gain G2 is less than 1.

Further, when the gain G2 is smaller than 1/p, the range between the minimum value $S_{min}$ and the maximum value $S_{max}$ stored in the integration value storage device 15 increases, necessitating an increase in the storage capacity of the integration value storage device 15. Accordingly, it is preferable that the gain G2 is the minimum value of multiplication of gain G1 and G2 (G1·G2). In other words, it is desirable that the minimum value of the variable gain G1 is 1.

The structure and operation of the variable-gain integrator 10 according to the present embodiment will be described using a more specific example.

The structure of the variable-gain integrator 10 will be described first. The bit width of the bus Bi is 3 bits, and the input data range from 0 (binary data "000") to 7 (binary data "111"). The variable multiplier 11 is a shift register for shifting the bit string to the left by 0, 1, 2 or 3. Consequently, gain G1 is 1, 2, 4, or 8. The adder 12 is formed by a 8-bit full adder. The clip circuit 13 is configured such that when the highest upper bit (MSB: Most Significant Bit) of 9-bit data supplied from the adder 12 is "0", it outputs the lower 8 bits of the 9-bit data as they are and when the MSB is "1", it outputs 255 ("11111111"). The fixed adder 14 is a shift register which shifts the 8-bit data supplied from the clip circuit 13 to the right by 4 bits and outputs the resultant 4-bit data to the bus Bo having bit width of 4. Accordingly, the gain G2 is 1/16 (=½⁴). The integration value storage device 15 is a 8-bit flip-flop capable of storing data between 0 ("00000000") and 255 ("11111111").

The operation of the variable-gain integrator 10 having the above structure will be described. Here, it is assumed that the input data x(n) (n=1, 2, 3 . . . ) is a fixed value 3 ("011") and that 2 is selected as gain G1.

First, an example case in which integration data y(4) are stored in the integration value storage device 15 will be described. In this example, the integration data y(4) are 24 ("00011000"). Receiving the input data x(5) supplied from the bus Bi, the variable multiplier 11 shifts the input data x(5), which is 3 ("011"), to the left by 1 bit and outputs 6 ("0110") to the adder 12. The adder 12 adds 6 ("0110") to the previous integration data y(4), which is 24 ("00011000"), and output the result, which is 30 ("000011110"), to the clip circuit 13. As the MSB of 30 ("000011110") is "0", the clip circuit 13 outputs 30 ("00011110") to the fixed multiplier 14 as the integration data y(5). The fixed multiplier 14 then shifts 30 ("00011110") to the right by 4 bits and outputs 1 ("0001") as output data z(5) to the bus Bo. On the other hand, the integration data y(5), 30 ("00011110"), obtained by the clip circuit 13, are stored in the integration value storage device 15 and supplied to the adder 12 at the next clock.

Next, an example case in which integration data y(42) are stored in the integration value storage device 15 will be described. In this example, the integration data y(42) are 252 ("11111100").

Receiving the input data x(43) supplied from the bus Bi, the variable multiplier 11 shifts the input data x(43), which is 3 ("011") to the left by 1 bit and outputs 6 ("0110") to the adder 12. The adder 12 adds 6 ("0110") to the previous integration data y(42), which is 252 ("11111100") and output the result, which is 258 ("100000010"), to the clip circuit 13. As the MSB of 258 ("100000010") is "1", the clip circuit 13 outputs 255 ("11111111") to the fixed multiplier 14 as the integration data y(43). The fixed multiplier 14 then shifts 255 ("11111111") to the right by 4 bits and outputs 15 ("1111") as output data z(43) to the bus Bo. On the other hand, the integration data y(43), 255 ("11111111"), obtained by the clip circuit 13, are stored in the integration value storage device 15 and supplied to the adder 12 at the next clock.

It should be understood that while only positive integers are used in the above examples, the present invention is not limited to such use. For example, when integers including negative numbers are used, 2's complement notation can be employed.

As described above, according to the present embodiment, the input data are multiplied by variable gain and the integration data are multiplied by fixed gain, so that the range of the final output data does not vary even when the gain is changed. This makes it possible to eliminate or simplify the clipping operation after the integration data are multiplied by gain and also to prevent the range of output data from narrowing in accordance with the gain. More specifically, because the input data are multiplied by variable gain and fixed gain is multiplied by the data downstream of the clip circuit, the range of the output data z(n) is fixed regardless of the variable gain value. Consequently, it is possible to prevent the range of actual output data z(n) from narrowing with respect to the allowable range of the output data z(n). Further, it is also possible to eliminate any need to modify the clipping operation downstream of the fixed multiplier 14 in accordance with the gain value. In addition, it is possible to eliminate the clip circuit downstream of the fixed multiplier 14, which results in reduction in the circuit scale and increase in the processing rate.

Further, because the gain G1 for the variable multiplier 11 is 1 or greater and the fixed gain G2 of the fixed multiplier 14 is less than 1, data loss does not occur in the variable multiplier 11 even when the data range of G1·G2 includes a value which is less than 1. Also, when the bit width of the bus Bo is j, the fixed gain G2 is set to $2^{-k}$ (k is a positive integer) and the bit width of data which can be stored by the integration value storage device 15 is set to (j+k). This setting allows the bit width of the output data of the fixed multiplier 14 to correspond to the bit width j of the bus Bo, thereby eliminating the need for the clip circuit downstream of the fixed multiplier 14.

Figure 3:
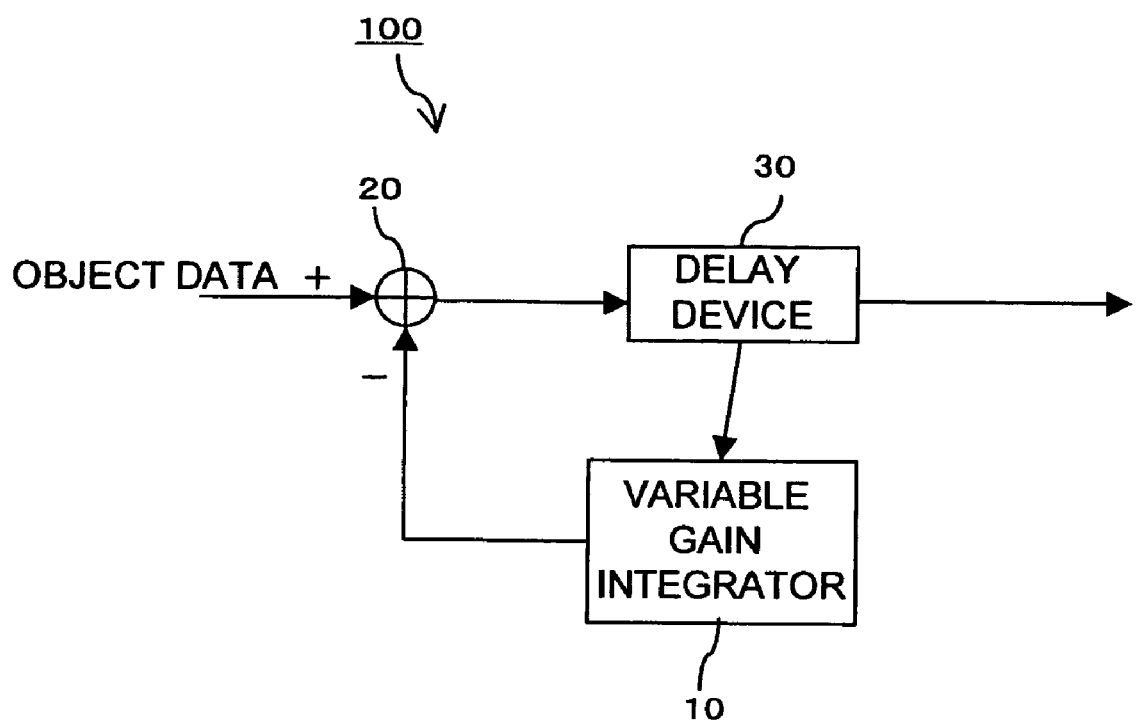
FIG. 3 is a block diagram showing a structure of a DC offset canceller having a variable-gain integrator.

FIG. 3 is a block diagram showing a DC offset canceller 100 which employs the variable-gain integrator 10. The offset canceller 100 is used to remove a direct current (dc) component contained in digital target data which are input in time sequence. Referring to FIG. 3, an adder 20 subtracts, from the canceller input data, the data z(n) output from the variable-gain integrator 10 as offset data so as to remove a dc component. The output data of the adder 20 from which a dc component has been cancelled are delayed by a delay device 30, and are then output as output data of the DC offset canceller and are also supplied to the variable-gain integrator 10 as input data.

With the DC offset canceller as described above, it is possible to appropriately remove a dc component because the range of data which are fed back from the variable-gain integrator 10 corresponds to the bit width of the bus regardless of the gain. Further, due to a simple clipping operation in the variable-gain integrator 10, the overall structure of the DC offset canceller is simplified.

It should also be noted that the present invention is not limited to the above examples and various changes may be made without departing the scope and spirit of the present invention. For example, while in the above examples, the variable multiplication means, the addition means, the data limitation means, the fixed multiplication means, and the integration value storage means are implemented by respective hardware circuits for dedicated use, each of the above means can be implemented in any suitable manner. As another example, each of the above means can be implemented by causing a CPU and an RAM to execute a program stored in a storage medium such as an ROM. In this case, advantageous effects can be obtained when the storage capacity assigned for the integration data and the range of output data z(n) which can be received on the receiving side, for example, are fixed.

Figure 4:
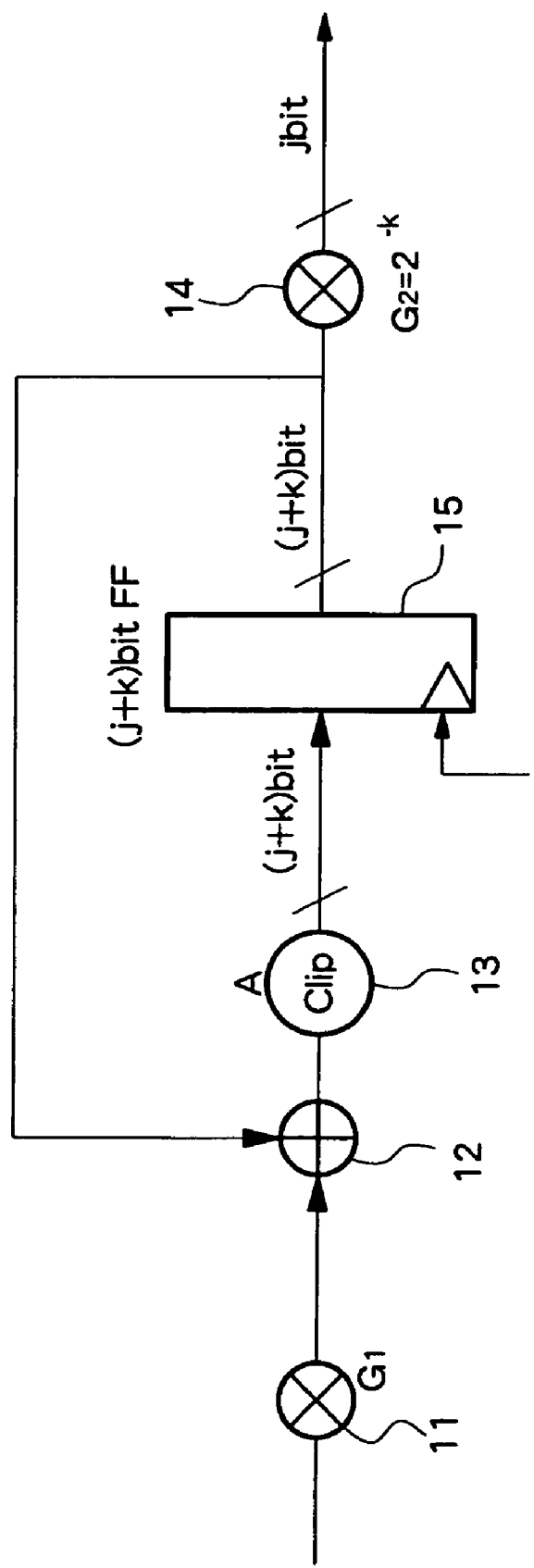
FIG. 4 is a block diagram showing another structure of a variable-gain integrator.

Further, in FIG. 2, the step S4 for multiplying by fixed gain and the step S5 for storing the integration data may be reversed or performed simultaneously. For example, a variable-gain integrator can be constituted as shown in FIG. 4. In this example, the integration value storage device 15 stores the integration data and then the fixed multiplier 14 multiplies fixed gain by the integration data stored in the integration value storage device 15. The variable-gain integrator shown in FIG. 4 outputs the output data z(n) at the timing which is later than that of the variable-gain integrator of FIG. 1 by 1 clock.

Examples of application of the variable-gain integrator 10 according to the present embodiment will be described with reference to the drawings. In the following, detailed description of the structures of the examples will be omitted.

Figure 5:
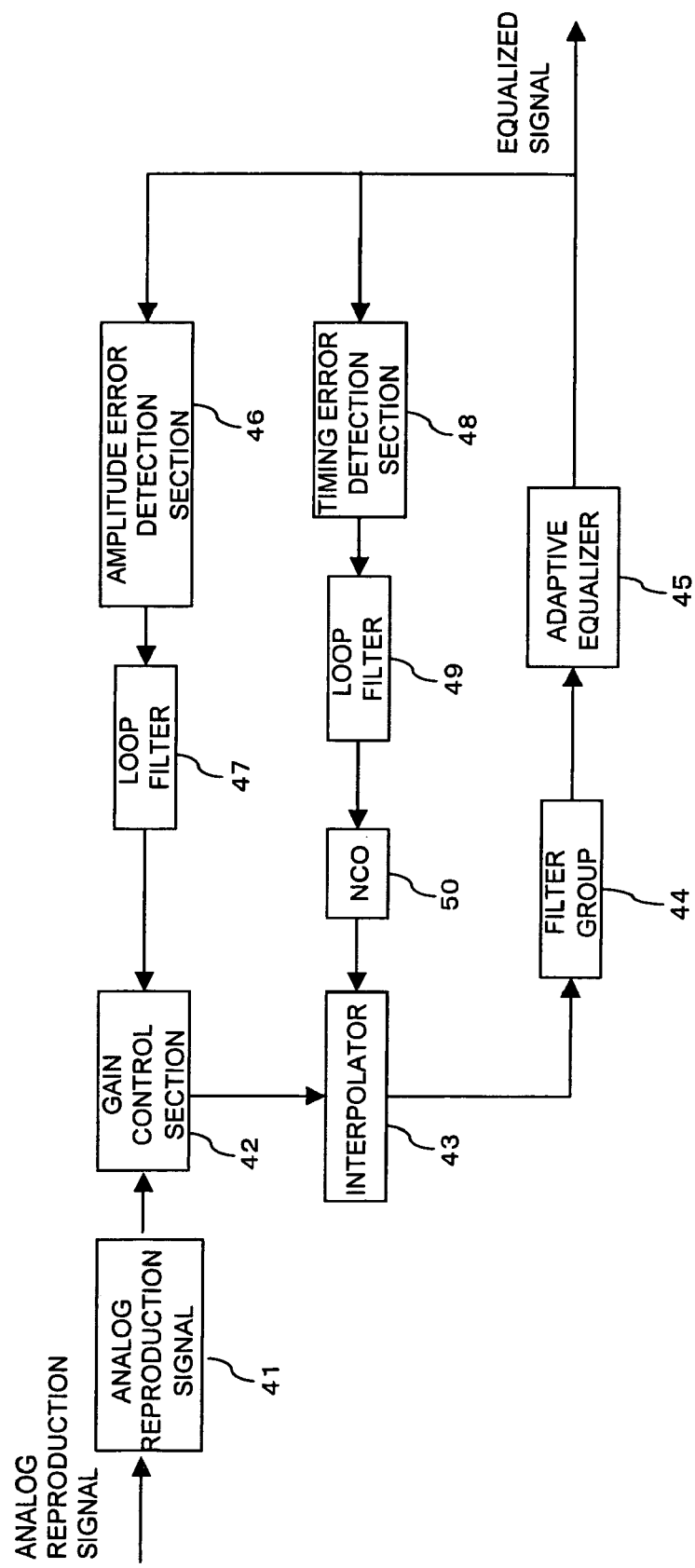
FIG. 5 is a block diagram showing a structure of a digital signal reproduction circuit.

FIG. 5 is a block diagram showing a structure of a digital signal reproduction circuit A digital signal reproduction circuit is used as a reproduction apparatus of a digital video camera, for example. Referring to FIG. 5, digital data recorded on a magnetic tape (not shown) are reproduced by a magnetic head (not shown) and then digitally sampled in an A/D conversion section 41. A digital signal output from the A/D conversion section 41 is multiplied by gain in a gain control section 42. An interpolator 43, based on the output signal of the gain control section 42, interpolates a data value at the data existing point of the digital data. The output signal from the interpolator 43 is subjected to waveform equalization at a filter group 44 and an adaptive equalizer 45 and is output as an equalized signal. This equalized signal is fed back to the gain control section 42 via an amplitude error detection section 46 and a loop filter 47, so that the gain is adjusted in the gain control section 42 in accordance with the feedback signal. Also, the equalized signal is fed back to the interpolator 43 via a timing error detection circuit 48, a loop filter 49, and an NCO (Numerical Controlled Oscillator) 50, so that the position of interpolation is adjusted in the interpolator 43 in accordance with the feedback signal.

Figure 6:
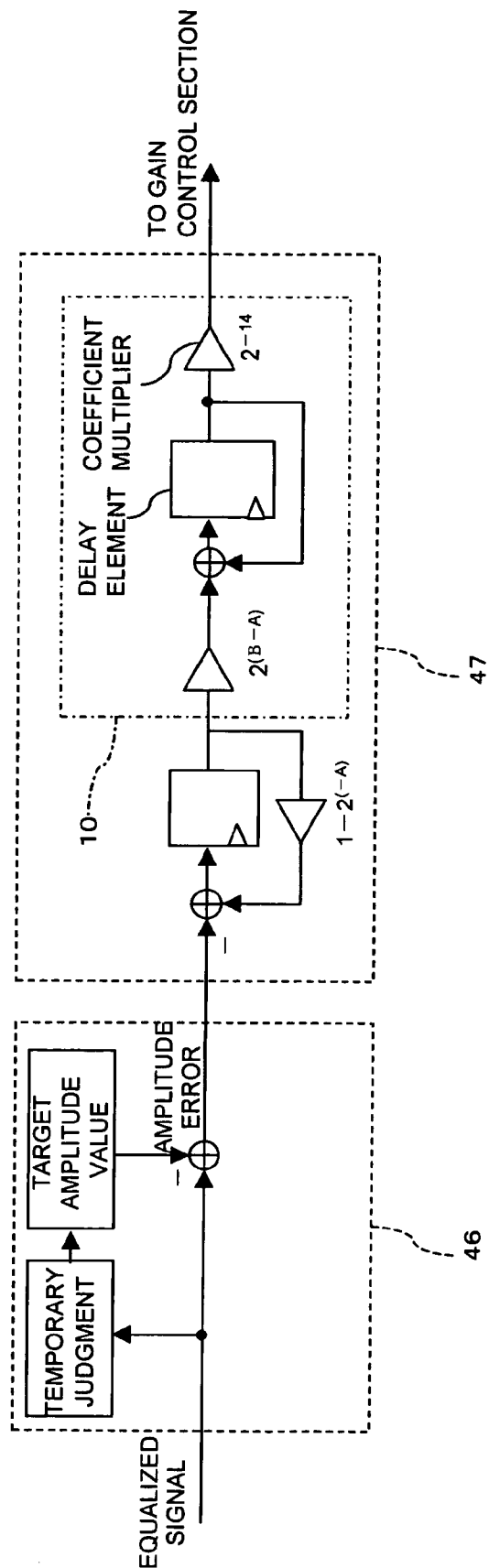
FIG. 6 is a block diagram showing the internal structures of a loop filter and an amplitude error detection section.
Figure 7:
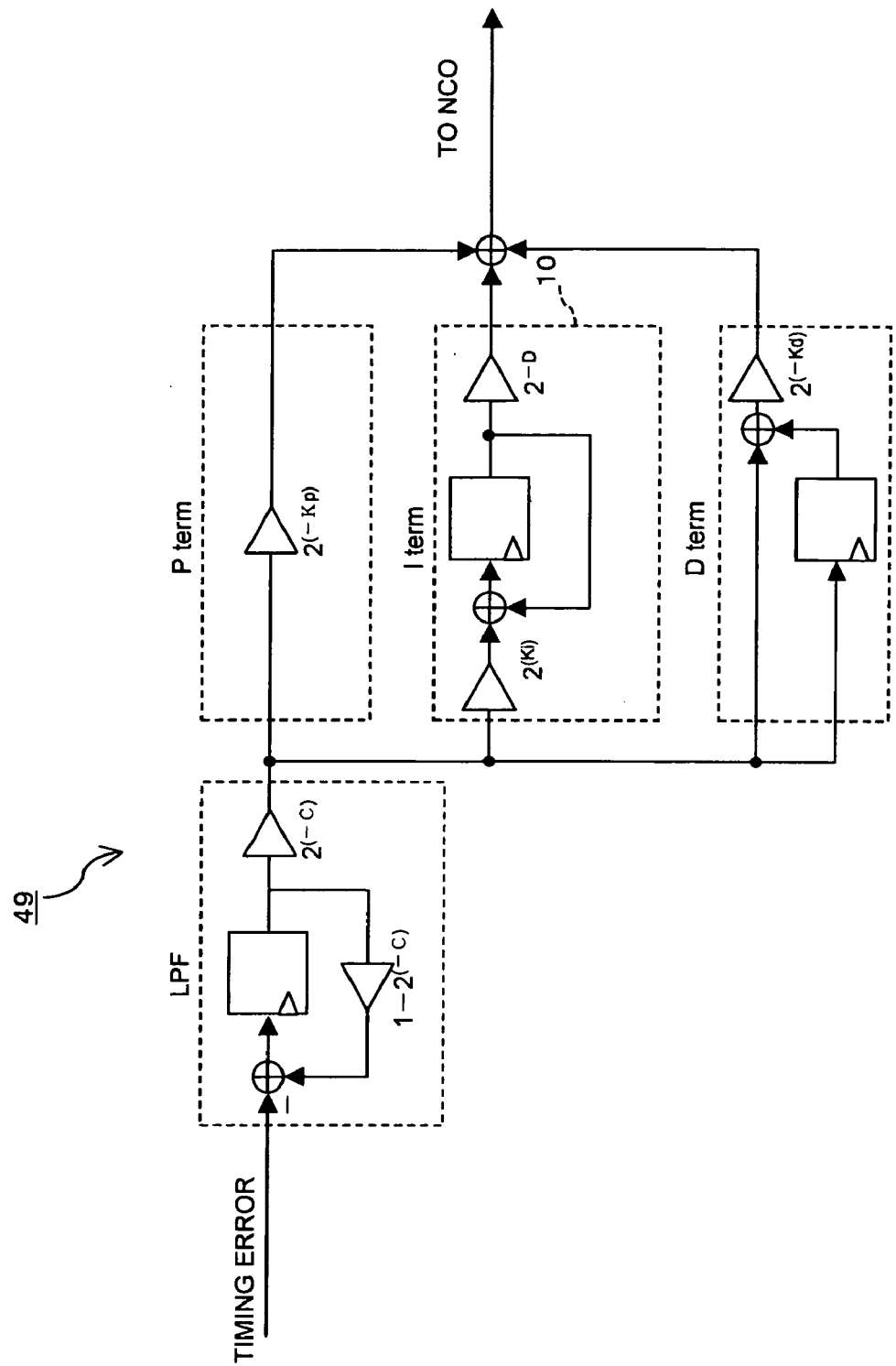
FIG. 7 is a block diagram showing the internal structure of a loop filter.
Figure 8:
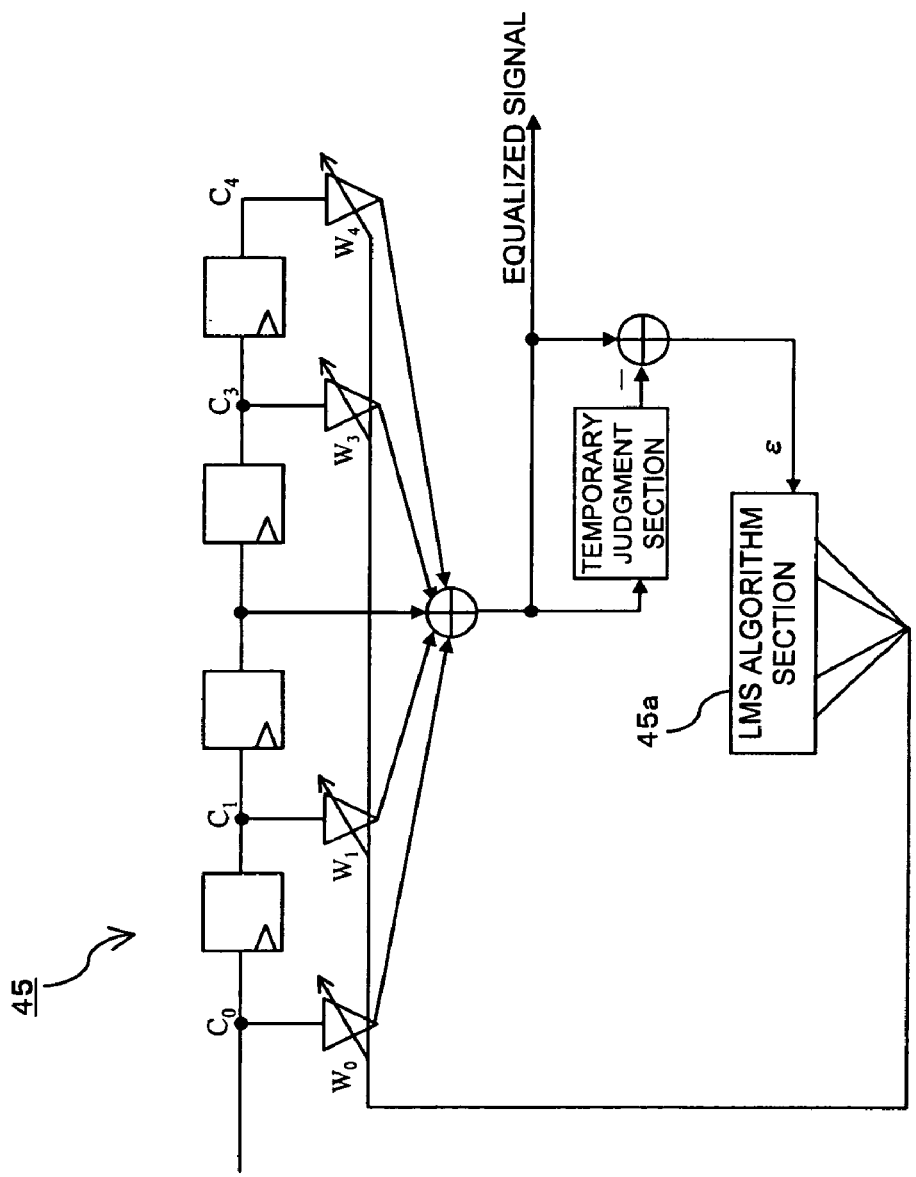
FIG. 8 is a block diagram showing the internal structure of an adaptive equalizer.
Figure 9:
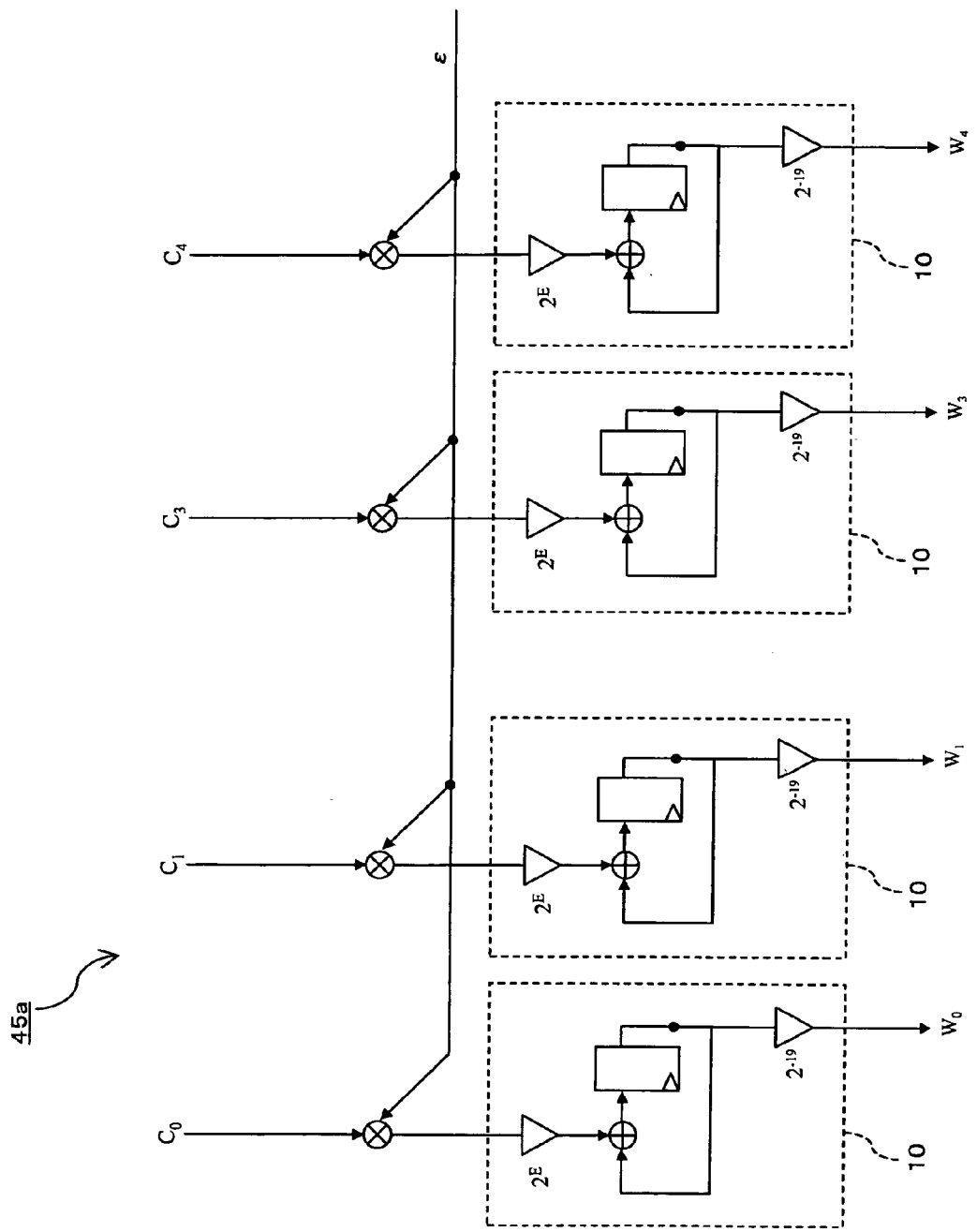
FIG. 9 is a block diagram showing the internal structure of an LMS algorithm section.

In the signal reproduction circuit described above, the variable-gain integrator 10 according to the present embodiment is used in the loop filter 47 in the AGC (Automatic Gain Control) circuit, the loop filter 49 inserted in the feed-back loop used for bit timing control, and the adaptive equalizer 45. FIG. 6 shows internal structures of the loop filter 47 and the amplitude error detection section 46. FIG. 7 shows an internal structure of the loop filter 49, and FIG. 8 shows an internal structure of the adaptive equalizer 45. Referring to FIG. 8, a signal input to the adaptive equalizer 45 is equalized by a variable FIR (finite impulse response) filter which is formed by four delay elements, four coefficient multipliers, and an adder. and is output as an equalized signal. The coefficient (filter coefficient) of the four coefficient multipliers is continuously renewed in accordance with an LMS (Least Mean Square) algorithm provided by an LMS algorithm section 45*a*, in which the variable-gain integrator 10 is used. FIG. 9 shows an internal structure of the LMS algorithm section 45*a*.

Figure 10:
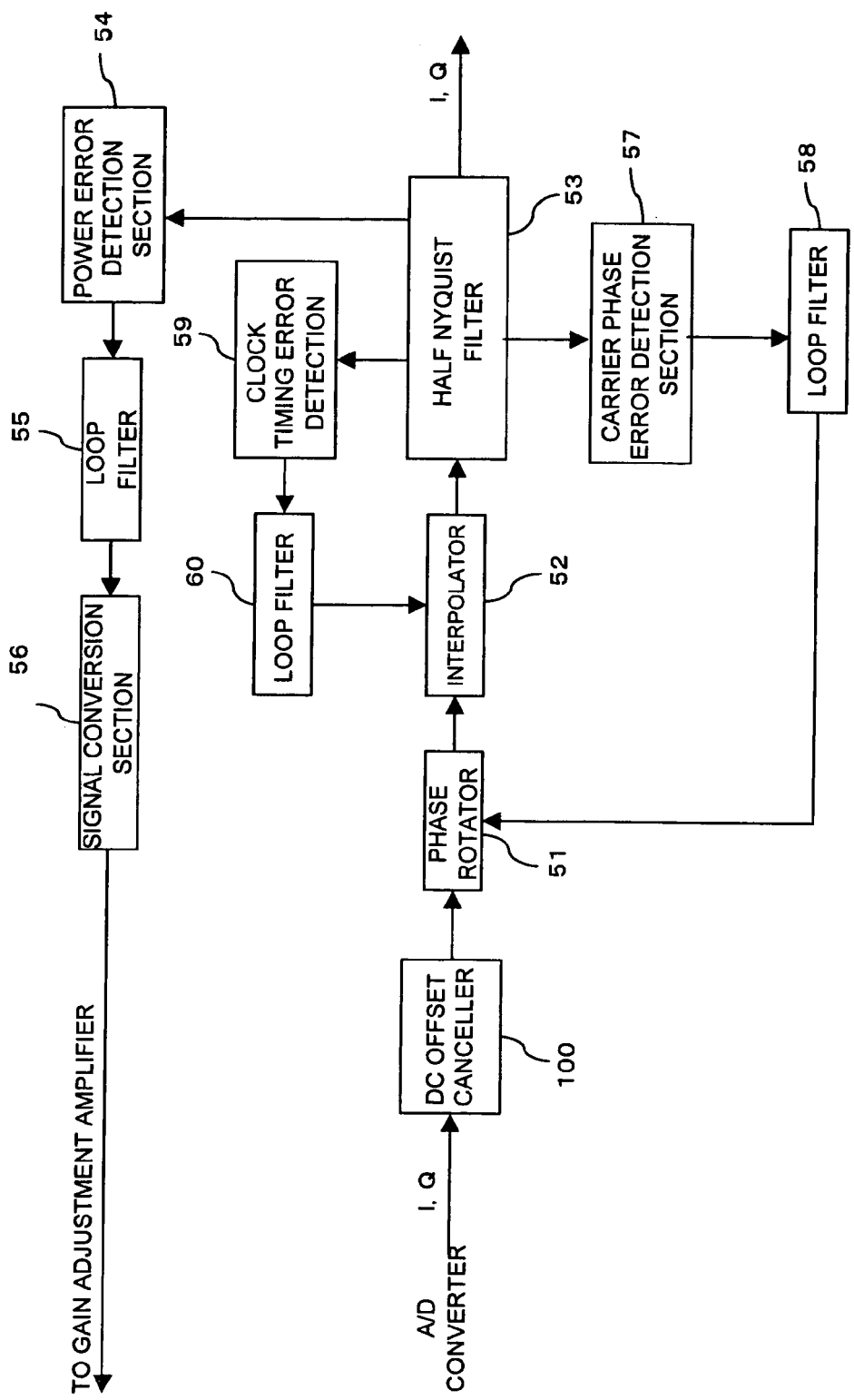
FIG. 10 is a block diagram showing a structure of a PSK (Phase Shift Keying) demodulation circuit.

FIG. 10 is a block diagram showing a structure of a PSK (Phase Shift Keying) demodulation circuit. Referring to FIG. 10, I and Q signals supplied from an A/D converter are input to the DC offset canceller 100 for removing a dc component from the respective signals and then supplied to a phase rotator 51 for rotating the phase. Then, an interpolator 52 interpolates I and Q signal values at the Nyquist point from the signals output from the phase rotator 51. The signals obtained by the interpolation are further supplied to a half Nyquist filter 53 formed by a FIR filter where the signal band is limited and output. The signals output from the half Nyquist filter 53 are fed back to a gain adjustment amplifier via a power error detection section 54, a loop filter 55, and a signal conversion section 56, so that the gain adjustment amplifier adjusts the gain with respect to the receiving wave in accordance with the feedback signals. The signals output from the half Nyquist filter 53 are also fed back to the phase rotator 51 via a carrier phase error detection section 57 and a loop filter 58, so that the phase rotator 51 adjusts the rotation amount in accordance with the feedback signals. Further, the signals output from the half Nyquist filter 53 are also fed back to the interpolator 52 via a clock timing error detection section 59 and a loop filter 60, so that the interpolator 52 adjusts the interpolation position in accordance with the feedback signals.

Figure 11:
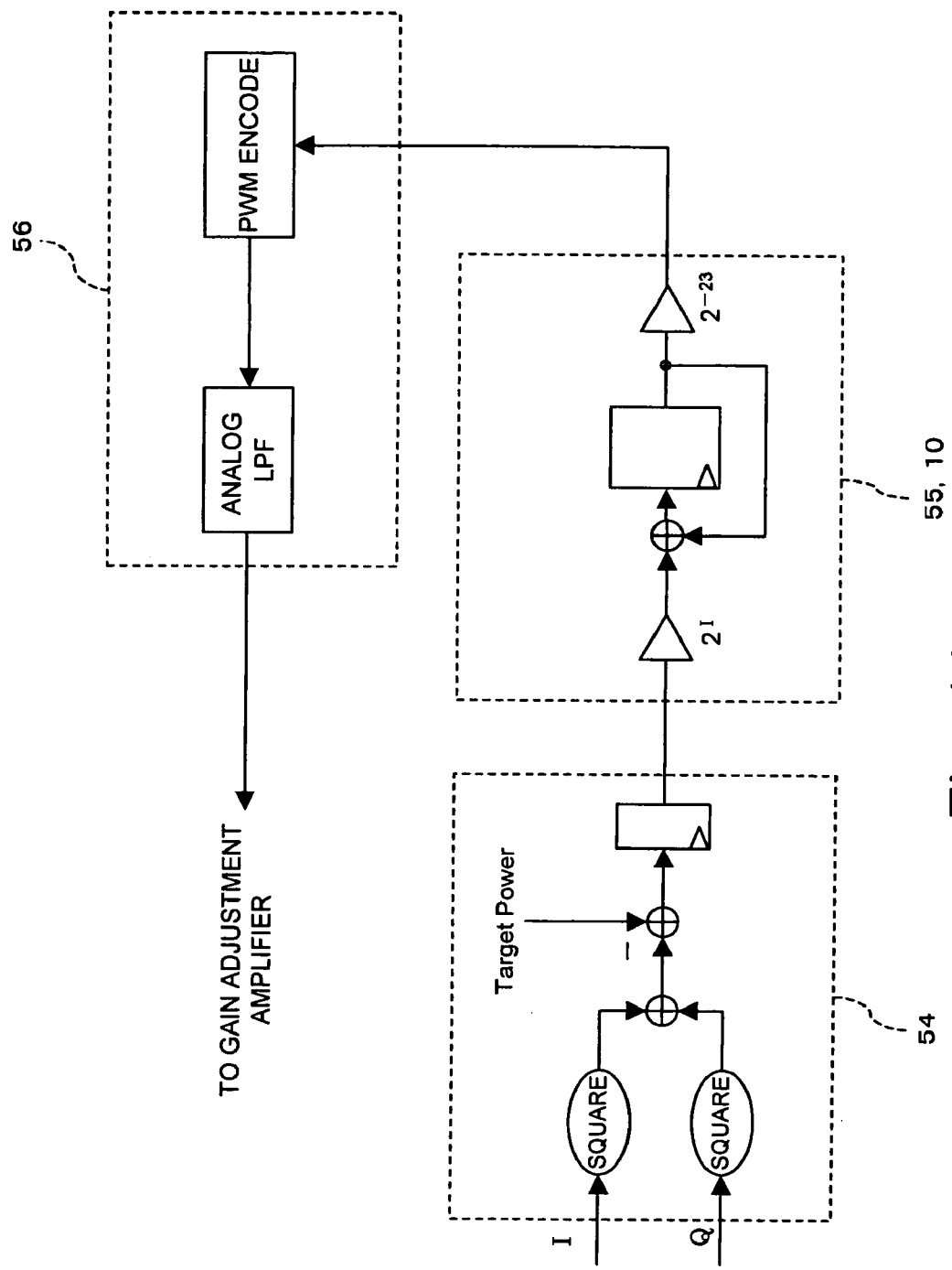
FIG. 11 is a block diagram showing the internal structures of a power error detection circuit, a loop filter, and a signal conversion section.
Figure 12:
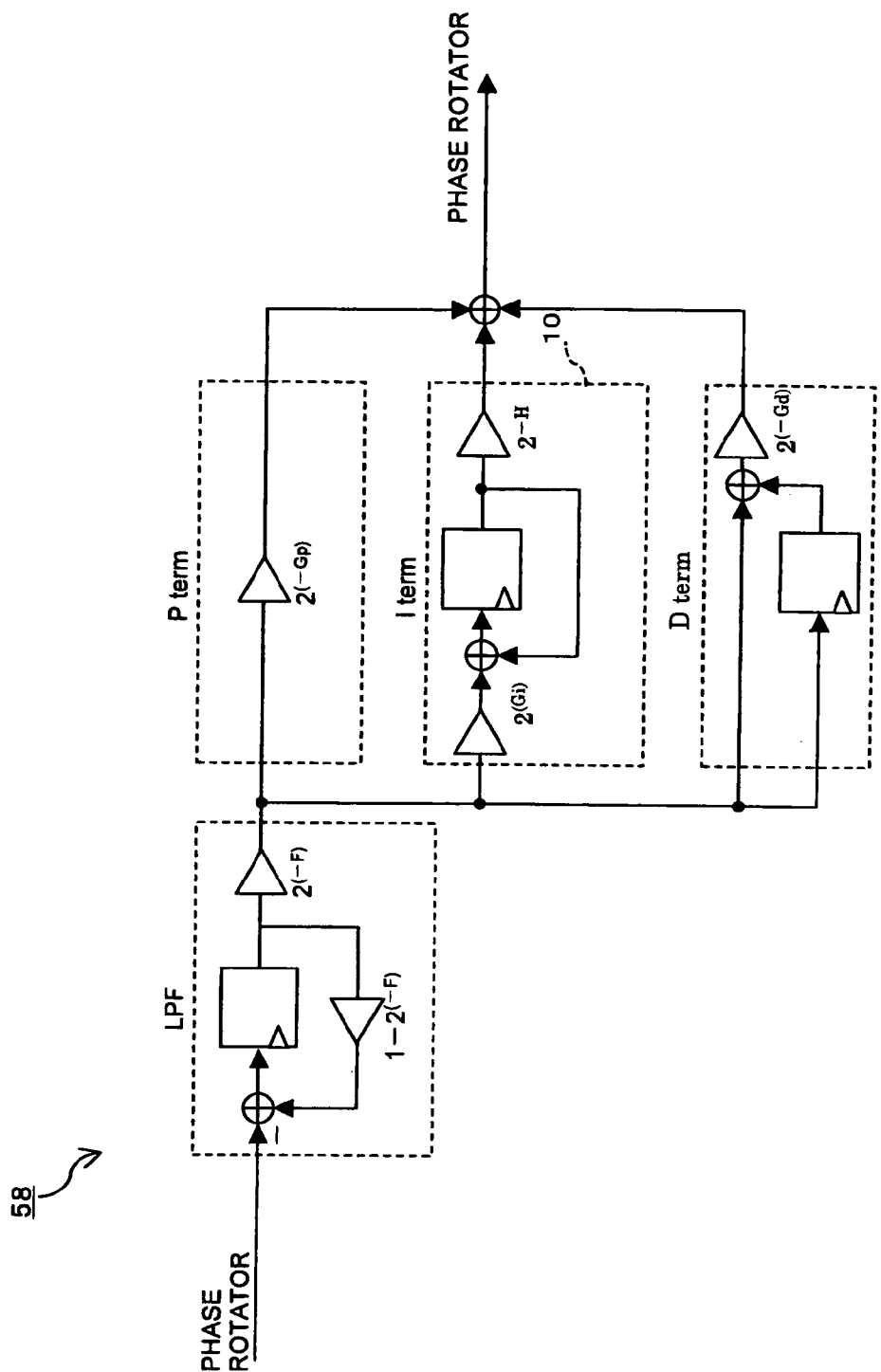
FIG. 12 is a block diagram showing the internal structure of a loop filter.

In the PSK demodulation circuit described above, the variable-gain integrator 10 according to the present embodiment is employed in the DC offset canceller 100, the loop filter 55 of the AGC (Automatic Gain Control) circuit, the loop filter 58 of the phase synchronization circuit, and the loop filter 60 used for timing synchronization. FIG. 11 shows the internal structures of the loop filter 55, the power error detection section 54, and the signal conversion section 56, while FIG. 12 shows the internal structure of the loop filter 58. Further, the internal structure of the DC offset canceller 100 is as shown in FIG. 3. In addition, the internal structure of the loop filter 60 is the same as that of the loop filter 49 shown in FIG. 7.

As described above, the variable-gain integrator according to the present embodiment can be suitably employed in various devices and circuits.

While the preferred embodiment of the present invention is described above using specific terms, such description is for illustrative purposes only, and it is to be understood that changes and variations may be made without departing from the spirit or scope of the appended claims.

What is claimed is:

1. A variable-gain integrator for accumulating and adding digital data which are input in time sequence comprising:
 variable multiplication means for multiplying the input data by variable gain;
 addition means for adding output data from the variable multiplication means to previous integration data;
 data limitation means for limiting output data from the addition means to a predetermined range to obtain integration data;
 integration value storage means for storing the integration data obtained from the data limitation means and supplying the integration data which are stored to the addition means as the previous integration data; and
 fixed multiplication means for multiplying the integration data obtained by the data limitation means by fixed gain.

2. A variable-gain integrator according to claim 1, wherein the variable gain of the variable multiplication means is 1 or greater and the fixed gain of the fixed multiplication means is less than 1.

3. A variable-gain integrator according to claim 1, wherein the bit width of a bus to which data obtained by the fixed multiplication means are output is j; the fixed gain is $2^{-k}$, where k is a positive integer; and the bit width of data which can be stored by the integration value storage means is (j+k).

4. A variable-gain integrator for accumulating and adding digital data which are input in time sequence comprising:
 a variable multiplier for multiplying the input data by variable gain;
 an adder for adding output data from the variable multiplier to previous integration data;
 a clip circuit for limiting output data from the adder to a predetermined range to obtain integration data;
 an integration value storage device for storing the integration data obtained from the clip circuit and supplying the integration data which are stored to the adder as the previous integration data; and
 a fixed multiplier for multiplying the integration data obtained by the clip circuit by fixed gain.

5. A variable-gain integrator according to claim 4, wherein the variable gain of the variable multiplier is 1 or greater and the fixed gain of the fixed multiplier is less than 1.

6. A variable-gain integrator according to claim 4, wherein the bit width of a bus to which data obtained by the fixed multiplier are output is j; the fixed gain is $2^{-k}$, where k is a positive integer; and the bit width of data which can be stored by the integration value storage device is (j+k).

7. A DC offset canceller for canceling a direct current component from digital object data which are input in time sequence, comprising:
 subtraction means for subtracting offset data from the object data; and
 a variable-gain integrator for accumulating and adding output data supplied from the subtraction means and for supplying, as the offset data, the resultant data to the subtraction means, wherein the variable-gain integrator including:
 variable multiplication means for multiplying the output data supplied from the subtraction means by variable gain;
 addition means for adding output data from the variable multiplication means to previous integration data;
 data limitation means for limiting output data from the addition means to a predetermined range to obtain integration data;
 integration value storage means for storing the integration data obtained from the data limitation means and supplying the integration data which are stored to the addition means as the previous integration data; and fixed multiplication means for multiplying the integration data obtained by the data limitation means by fixed gain to obtain the offset data.

8. A DC offset canceller for canceling a direct current component from digital object data which are input in time sequence, comprising:
   a subtracter for subtracting offset data from the object data; and
   a variable-gain integrator for accumulating and adding output data supplied from the subtracter and for supplying, as the offset data, the resultant data to the subtracter, wherein the variable-gain integrator including:
   a variable multiplier for multiplying the output data supplied from the subtracter by variable gain;
   an adder for adding output data from the variable multiplier to previous integration data;
   a clip circuit for limiting output data from the adder to a predetermined range to obtain integration data;
   an integration value storage device for storing the integration data obtained from the clip circuit and supplying integration data which are stored to the adder as the previous integration data; and
   a fixed multiplier for multiplying the integration data obtained by the clip circuit by fixed gain to obtain the offset data.

9. An integrated-circuit-based variable-gain integration method for accumulating and adding digital input data which are input in time sequence, comprising:
   a variable multiplication step for multiplying the input data by variable gain;
   an addition step for adding data obtained by the variable multiplication step to previous integration data which are stored;
   a data limitation step for limiting data obtained by the addition step to a predetermined range to obtain integration data;
   a fixed multiplication step for multiplying the integration data obtained by the data limitation step by fixed gain; and
   an integration value storage step for storing the integration data obtained by the data limitation step.

10. A computer readable medium containing a variable-gain integration program for instructing a computer to accumulate and add digital input data which are input in time sequence, wherein the variable-gain integration program instructs the computer to execute:
   a variable multiplication step for multiplying the input data by variable gain;
   an addition step for adding data obtained by the variable multiplication step to previous integration data which are stored;
   a data limitation step for limiting data obtained by the addition step to a predetermined range to obtain integration data;
   a fixed multiplication step for multiplying the integration data obtained by the data limitation step by fixed gain; and
   an integration value storage step for storing the integration data obtained by the data limitation step.

* * * * *